(12) United States Patent
Kimura et al.

(10) Patent No.: US 11,732,359 B2
(45) Date of Patent: Aug. 22, 2023

(54) WAFER HOLDER

(71) Applicant: Sumitomo Electric Industries, Ltd., Osaka (JP)

(72) Inventors: Koichi Kimura, Itami (JP); Akira Mikumo, Itami (JP); Shigenobu Sakita, Itami (JP); Daisuke Shimao, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 159 days.

(21) Appl. No.: 16/498,853

(22) PCT Filed: Feb. 8, 2018

(86) PCT No.: PCT/JP2018/004421
§ 371 (c)(1),
(2) Date: Sep. 27, 2019

(87) PCT Pub. No.: WO2018/179891
PCT Pub. Date: Oct. 4, 2018

(65) Prior Publication Data
US 2020/0340102 A1    Oct. 29, 2020

(30) Foreign Application Priority Data

Mar. 28, 2017  (JP) .................... 2017-062458

(51) Int. Cl.
*C23C 16/458*  (2006.01)
*C23C 14/50*  (2006.01)
*H01L 21/683*  (2006.01)
(Continued)

(52) U.S. Cl.
CPC ............ *C23C 16/458* (2013.01); *C23C 14/50* (2013.01); *C23C 16/4586* (2013.01);
(Continued)

(58) Field of Classification Search
CPC ... C23C 14/50; C23C 16/458; C23C 16/5096; C23C 16/4586; C23C 16/46;
(Continued)

(56) References Cited

U.S. PATENT DOCUMENTS 5,951,772 A * 9/1999 Matsuse .............. C23C 16/4557
   118/723 R
6,267,839 B1 * 7/2001 Shamouilian .......... B23Q 3/154
   156/345.51
(Continued)

FOREIGN PATENT DOCUMENTS

JP          9-213455 A       8/1997
JP       2002231798 A  *   8/2002
(Continued)

OTHER PUBLICATIONS

English Machine Translation of Atari JP2002231798A retrieved from ESPACENET May 5, 2021 (Year: 2021).*
(Continued)

*Primary Examiner* — Ram N Kackar
*Assistant Examiner* — Laureen Chan
(74) *Attorney, Agent, or Firm* — McCarter & English, LLP; Michael A. Sartori (57) ABSTRACT

A wafer holder comprising: a ceramic base having a wafer-mounting surface as an upper surface; and a conductive member embedded in the ceramic base, the conductive member including a circuit portion provided parallel to the wafer-mounting surface, a pull-out portion provided parallel to the wafer-mounting surface and spaced from the circuit portion in a direction opposite to a direction toward the wafer-mounting surface, and a connecting portion configured to electrically connect the circuit portion and the pull-out portion to each other.

10 Claims, 7 Drawing Sheets

(51) Int. Cl.
 *H05B 3/03* (2006.01)
 *H01L 21/02* (2006.01)
 *H01J 37/32* (2006.01)

(52) U.S. Cl.
 CPC .. *H01J 37/32715* (2013.01); *H01J 37/32724* (2013.01); *H01L 21/02274* (2013.01); *H01L 21/6831* (2013.01); *H05B 3/03* (2013.01)

(58) Field of Classification Search
 CPC ........... H01J 37/32715; H01J 37/32724; H01J 37/32577; H01L 21/02274; H01L 21/6831; H01L 21/67103; H01L 21/68714; H01L 21/68757; H01L 21/68785; H01L 21/68792; H05B 3/03; H05B 3/283
 See application file for complete search history.

(56) References Cited

U.S. PATENT DOCUMENTS

| | | | |
|---|---|---|---|
| 2006/0191639 A1* | 8/2006 | Tanaka | H01L 21/67103 156/345.52 |
| 2009/0241837 A1* | 10/2009 | Hanada | C04B 35/581 118/725 |
| 2017/0352567 A1* | 12/2017 | Cho | C23C 16/4587 |
| 2018/0174878 A1 | 6/2018 | Kimura et al. | |
| 2019/0355556 A1* | 11/2019 | Takahashi | H01J 37/32715 |

FOREIGN PATENT DOCUMENTS

| | | | | |
|---|---|---|---|---|
| JP | 2005277335 A | * | 10/2005 | |
| JP | 2006-179897 A | | 7/2006 | |
| JP | 2012-089694 A | | 5/2012 | |
| JP | 2013-026312 A | | 2/2013 | |
| JP | 2014-75525 A | | 4/2014 | |
| JP | 2014-222697 A | | 11/2014 | |
| JP | 2014222697 A | * | 11/2014 | |
| JP | 2017-22284 A | | 1/2017 | |

OTHER PUBLICATIONS

English Machine Translation of Hori (JP2005277335A) retrieved from ESPACENET on Apr. 26, 2022 (Year: 2022).*

* cited by examiner

DIAGRAM TAKEN ALONG A1-A1 IN DIRECTION OF ARROWS

DIAGRAM TAKEN ALONG B1-B1 IN DIRECTION OF ARROWS

| DIAGRAM TAKEN ALONG A2-A2 IN DIRECTION OF ARROWS | DIAGRAM TAKEN ALONG B2-B2 IN DIRECTION OF ARROWS | DIAGRAM TAKEN ALONG C2-C2 IN DIRECTION OF ARROWS |

DIAGRAM TAKEN ALONG A3-A3 IN DIRECTION OF ARROWS

DIAGRAM TAKEN ALONG B3-B3 IN DIRECTION OF ARROWS

DIAGRAM TAKEN ALONG A4-A4 IN DIRECTION OF ARROWS

DIAGRAM TAKEN ALONG B4-B4 IN DIRECTION OF ARROWS

WAFER HOLDER

TECHNICAL FIELD

The present disclosure relates to a wafer holder. The present application claims priority to Japanese Patent Application No. 2017-062458 filed on Mar. 28, 2017, the entire contents of which are incorporated herein by reference.

BACKGROUND ART

In a semiconductor manufacturing apparatus that manufactures a semiconductor device such as an LSI, a semiconductor wafer is subjected to various thin film processes such as a deposition process including CVD and sputtering as well as an etching process. These thin film processes may be performed in a plasma atmosphere. In the semiconductor manufacturing apparatus, therefore, one of radio frequency (RF) electrodes (lower electrode) is embedded in a wafer holder, also called a susceptor, which is mounted in a chamber and on which a wafer is placed and heated, while the other radio frequency electrode (upper electrode) is provided above the wafer holder so as to face the lower electrode, and a radio frequency (RF) voltage is applied between these electrodes. As such, a source material gas introduced into the chamber can be ionized to generate plasma in a space above the wafer holder.

As a susceptor including a lower electrode and a resistance heating element, a wafer holder including a disk-shaped ceramic base having a flat wafer-mounting surface as an upper surface, and a cylindrical support for supporting the ceramic base from a central portion of a lower surface of the ceramic base is disclosed in PTL 1, for example. Two types of radio frequency (RF) electrodes as the lower electrode are embedded in the ceramic base at different depths from the wafer-mounting surface from each other. It is also mentioned that an electrostatic chuck (ESC) electrode for electrically fixing a semiconductor wafer by suction may be further provided in this ceramic base.

CITATION LIST

Patent Literature

PTL 1: Japanese Patent Laying-Open No. 2012-89694

SUMMARY OF INVENTION

A wafer holder of the present disclosure includes a ceramic base having a wafer-mounting surface as an upper surface, and a conductive member embedded in the ceramic base. The conductive member includes a circuit portion provided parallel to the wafer-mounting surface, a pull-out portion provided parallel to the wafer-mounting surface and spaced from the circuit portion in a direction opposite to a direction toward the wafer-mounting surface, and a connecting portion configured to electrically connect the circuit portion and the pull-out portion to each other.

DETAILED DESCRIPTION

As described above, in a wafer holder, the upper surface of a ceramic base acts as a wafer-mounting surface. Thus, terminal portions for feeding power to an RF electrode, a resistance heating element and the like embedded in the ceramic base need to be provided on the lower surface of the ceramic base. These terminal portions reach a high temperature together with the ceramic based during processing of a semiconductor wafer, and thus need to be protected against corrosive gas such as halogen gas that is introduced into a chamber as reactive gas during CVD, etching and the like.

Therefore, it is commonly practiced that the terminal portions for the RF electrode, the resistance heating element and the like, and power feed lines connected to the terminal portions are housed on the inner side of the above-described cylindrical support, and the opposite ends of the cylindrical support are hermetically sealed to the lower surface of the ceramic base and a floor surface of the chamber, respectively. While such a structure can prevent breakage of the terminal portions due to corrosion, it is required to arrange the terminal portions at a central portion of the lower surface of the ceramic base where the cylindrical support is attached. As a result, power is fed from the terminal portions at the central portion to the RF electrode, the resistance heating element and the like that are laid out substantially entirely within a plane parallel to the wafer-mounting surface in the ceramic base. This tends to cause an excessive electrical load to be applied to a connecting portion between the terminal portions and the RF electrode, the resistance heating element and the like. As such, local overheat may occur at this connecting portion of the ceramic base, resulting in decrease in thermal uniformity of the wafer-mounting surface, or breakage of the ceramic base itself.

First, embodiments of the present disclosure will be listed and described. A wafer holder of the present disclosure includes: a ceramic base having a wafer-mounting surface as an upper surface; and a conductive member embedded in the ceramic base, the conductive member including a circuit portion provided parallel to the wafer-mounting surface, a pull-out portion provided parallel to the wafer-mounting surface and spaced from the circuit portion in a direction opposite to a direction toward the wafer-mounting surface, and a connecting portion configured to electrically connect the circuit portion and the pull-out portion to each other. The ceramic base may have a disk shape. As such, it is possible to feed power to the conductive member such as an RF electrode embedded in the ceramic base from its terminal portion, without applying an excessive electrical load.

The wafer holder described above may further include: a cylindrical support configured to support the ceramic base from a central portion of a lower surface of the ceramic base; and an electrode terminal portion connected to the pull-out portion, in which a portion of the electrode terminal portion may protrude from the lower surface of the ceramic base and be housed in the cylindrical support. The cylindrical support may have a circular cylindrical shape. As such, the electrode terminal portion and a power feed line connected thereto can be housed on the inner side of the cylindrical support, and can therefore be isolated from a corrosive environment.

In the wafer holder described above, the conductive member may constitute an RF electrode or a resistance heating element. The wafer holder may include a plurality of the conductive members, each of the plurality of the conductive members constituting an RF electrode or a resistance heating element. As such, an excessive electrical load to the terminal portion to the conductive member such as an RF electrode can be reduced, so that high reliability can be maintained for a long period of time. In addition, the resistance heating element has increased flexibility in design of a circuit pattern, thereby improving the thermal uniformity. Furthermore, a higher voltage can be applied to the RF electrode and the resistance heating element than was heretofore possible, so that the processing speed can be increased.

The wafer holder described above may further include: a second circuit portion embedded in the ceramic base and provided parallel to the wafer-mounting surface; and a second electrode terminal portion connected to the second circuit portion, in which a portion of the second electrode terminal portion may protrude from the lower surface of the ceramic base. The second circuit portion may be an RF electrode or a resistance heating element or an electrostatic chuck electrode. As such, the flexibility in type and shape of electrodes embedded in the ceramic base can be increased.

In the wafer holder described above, the connecting portion may be a ceramic member covered with a metal layer. As such, even if the wafer holder repeats thermal expansion and contraction due to heat cycle, the possibility of breakage of the wafer holder can be reduced.

Figure 1A:
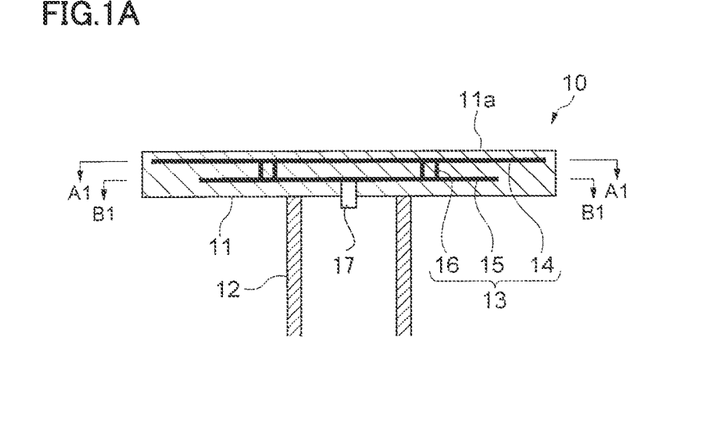
FIG. 1A is a schematic vertical sectional view of a wafer holder in a first embodiment.
Figure 1B:
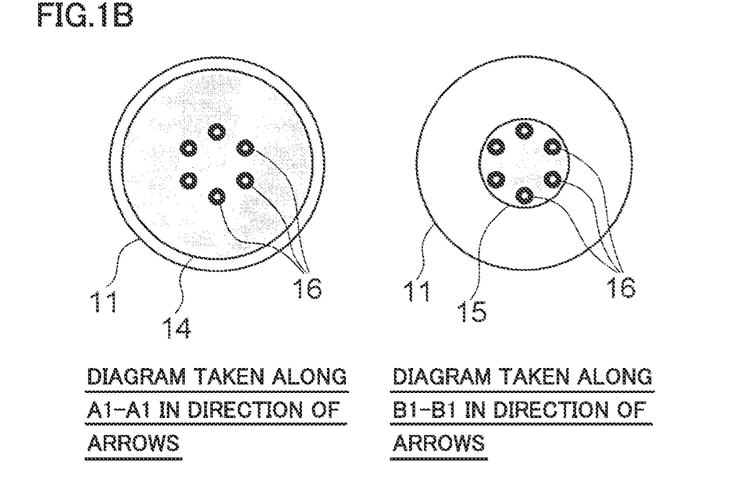
FIG. 1B shows a ceramic base in FIG. 1A taken along A1-A1 and B1-B1 in directions of arrows, respectively.

Next, a wafer holder in a first embodiment is described with reference to FIGS. 1A and 1B. A wafer holder 10 in the first embodiment shown in FIG. 1A is to be mounted into a chamber not shown in the figure, in which a semiconductor wafer is subjected to thin film processes in a plasma atmosphere such as plasma CVD. Wafer holder 10 includes a disk-shaped ceramic base 11 having a wafer-mounting surface 11a as an upper surface, and a cylindrical support 12 having a circular cylindrical shape for supporting ceramic base 11 from a central portion of a lower surface of ceramic base 11. The term "disk shape" as used herein does not refer to a geometrically precise disk, but includes processing errors and the like. The term "circular cylindrical shape" as used herein does not refer to a geometrically precise cylin-der, but includes processing errors and the like. The material for cylindrical support 12 is preferably ceramic.

Examples of the ceramic as a material suitable for ceramic base 11 and cylindrical support 12 include aluminum nitride, silicon nitride, silicon carbide, and aluminum oxide. Of these materials, the aluminum nitride having high thermal conductivity and high corrosion resistance is most preferable. Cylindrical support 12 has opposite ends, each of which is bent outward to form a flange, for example. An upper end face of cylindrical support 12 may be joined to the lower surface of ceramic base 11 by sintering. Alternatively, cylindrical support 12 may be joined to the lower surface of ceramic base 11 with connecting means such as screws that extend through the flange-shaped bent portion. A lower end portion of cylindrical support 12 may be joined to a bottom surface of the chamber in a manner similar to the upper end portion. It is preferable, however, for the lower end portion to be removably fixed with connecting means such as a clamp.

A single conductive member 13 as a lower electrode of RF electrodes is embedded in ceramic base 11. Conductive member 13 includes: a circuit portion 14 parallel to wafer-mounting surface 11a; a pull-out portion 15 parallel to wafer-mounting surface 11a and spaced from circuit portion 14 in a thickness direction of ceramic base 1; and six connecting portions 16 electrically connecting circuit portion 14 and pull-out portion 15 to each other. That is, ceramic base 1 has pull-out portion 15 spaced from circuit portion 14 in a direction opposite to a direction toward wafer-mounting surface 11a. Circuit portion 14 and pull-out portion 15 each have a circular pattern, as can be seen from FIG. 1B showing ceramic base 11 in FIG. 1A taken along A1-A1 and B1-B1 in directions of arrows, respectively. Circuit portion 14 and pull-out portion 15 are arranged concentrically with respect to the center of ceramic base 11. Pull-out portion 15 has a smaller outside diameter than circuit portion 14. Six connecting portions 16 are arranged at regular intervals in a circumferential direction at an outer circumferential portion of pull-out portion 15.

The material for circuit portion 14 and pull-out portion 15 is not particularly limited as long as it is electrically conductive. For example, a piece of metal foil such as stainless foil may be laid out. For example, paste containing metal powders such as tungsten may be screen printed and sintered to form these portions. The material for connecting portions 16 is not particularly limited either, as long as it is electrically conductive. As one example, a cylindrical ceramic member having an outer surface covered with a metal layer is preferable. An example method of forming the metal layer includes applying metal paste to the surface of the ceramic member, followed by degreasing and sintering. As another example of the metal layer, a metallic sleeve molded into a cylindrical shape in advance so as to fit onto the ceramic member may be employed. The above-described ceramic member preferably has substantially the same coefficient of thermal expansion, and is more preferably made of the same material, as above-described ceramic base 11. As such, even if thermal expansion and thermal contraction due to heat cycle are repeated, this ceramic member can be expanded and contracted in a manner similar to ceramic base 11. Accordingly, problems such as decrease in thermal uniformity and breakage are less likely to occur.

A single metallic electrode terminal portion 17 is connected to a central portion of pull-out portion 15. Electrode terminal portion 17 has a tip portion protruding at the central portion of the lower surface of ceramic base 1. That is, a portion of electrode terminal portion 17 protrudes from the lower surface of ceramic base 11. As such, electrode terminal portion 17 and a power feed line (not shown) connected to electrode terminal portion 17 can be housed on the inner side of cylindrical support 12. It should be noted that a temperature sensor such as a thermocouple, a resistance heating element, an electrostatic chuck electrode and the like not shown in the figure may be provided in ceramic base 11. In this case, their terminal portions can also be protruded from the central portion of the lower surface of ceramic base 11 to thereby be housed on the inner side of cylindrical support 12 together with electrode terminal portion 17. The power feed line extending downward on the inner side of cylindrical support 12 can be pulled out of the chamber through a through hole in the bottom surface of the chamber (not shown).

Such a configuration can suppress the problem of electrical overload that tends to occur at a connecting portion between conductive member 13 and the electrode terminal portion during the application of a radio frequency voltage to conductive member 13. Particularly, in the case of an RF electrode, the smaller the spacing between its circuit portion and wafer-mounting surface, the better. This carries a risk of breakage of a thin-plate portion of the ceramic base that is closer to the wafer-mounting surface than the circuit portion when an excessive electrical load is applied to the circuit portion. By using the plurality of connecting portions 16 as in wafer holder 10 of the present disclosure, however, a current can be suitably distributed. Thus, the problem of local overload can be suppressed. As such, the reliability of a semiconductor manufacturing apparatus having wafer holder 10 mounted thereon can be improved.

Figure 2A:
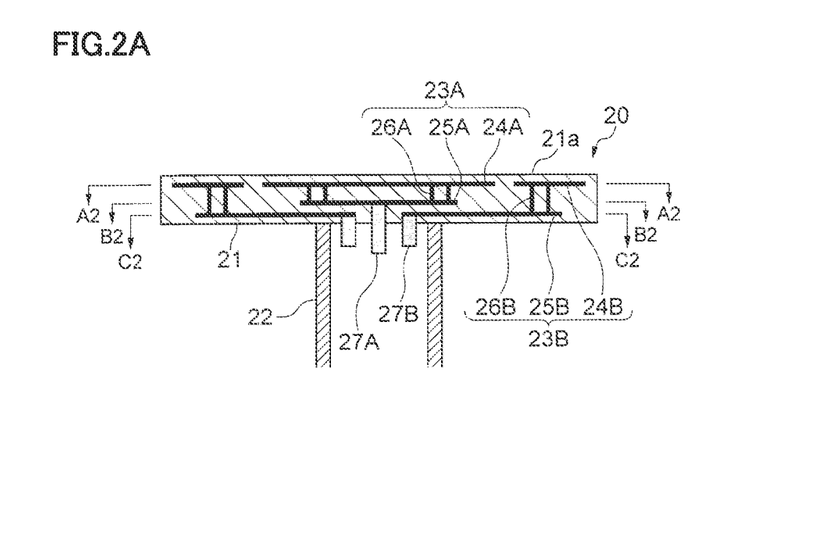
FIG. 2A is a schematic vertical sectional view of a wafer holder in a second embodiment.

Next, a wafer holder 20 in a second embodiment is described with reference to FIGS. 2A and 2B. As shown in FIG. 2A, wafer holder 20 including a disk-shaped ceramic base 21 and a cylindrical support 22 for supporting ceramic base 21 from a central portion of a lower surface of ceramic base 21 is basically the same as wafer holder 10 in the first embodiment, except that a plurality of conductive members are provided in ceramic base 21. Accordingly, ceramic base 21 will be specifically described hereinafter.

Two conductive members 23A and 23B as RF electrodes are embedded in ceramic base 21. First conductive member 23A includes: a circuit portion 24A parallel to a wafer-mounting surface 21a; a pull-out portion 25A parallel to wafer-mounting surface 21a and spaced from circuit portion 24A in a thickness direction of ceramic base 21; and six connecting portions 26A electrically connecting circuit portion 24A and pull-out portion 25A to each other. That is, ceramic base 21 has pull-out portion 25A spaced from circuit portion 24A in a direction opposite to a direction toward wafer-mounting surface 21a. Second conductive member 23B includes, similarly to the first one described above: a circuit portion 24B parallel to wafer-mounting surface 21a; a pull-out portion 25B parallel to wafer-mounting surface 21a and spaced from circuit portion 24B in the thickness direction of ceramic base 21; and four connecting portions 26B electrically connecting circuit portion 24B and pull-out portion 25B to each other. That is, ceramic base 21 has pull-out portion 25B spaced from circuit portion 24B in the direction opposite to the direction toward wafer-mounting surface 21a.

Figure 2B:
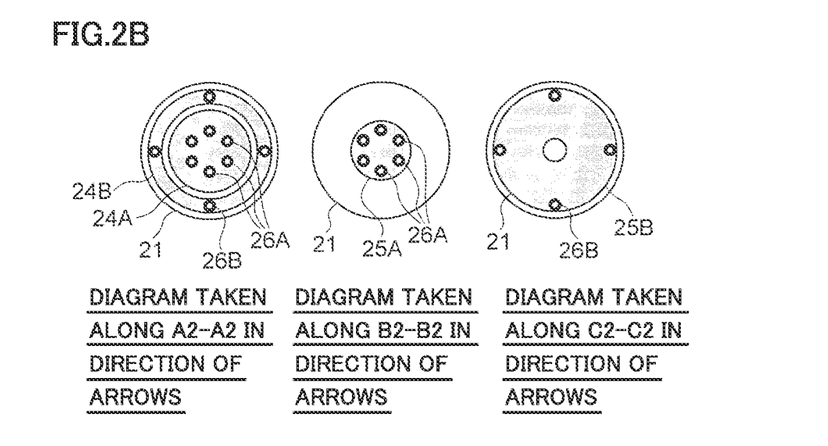
FIG. 2B shows a ceramic base in FIG. 2A taken along A2-A2, B2-B2 and C2-C2 in directions of arrows, respectively.

As can be seen from FIG. 2B, circuit portions 24A and 24B are embedded in the same layer closest to wafer-mounting surface 21a. Thus, circuit portion 24A has a concentric circular pattern having a smaller outside diameter than wafer-mounting surface 21a. Circuit portion 24B has a concentric annular pattern to surround the outer circumference of circuit portion 24A. Pull-out portion 25A is embedded in a layer located substantially at the center in the thickness direction of ceramic base 21. Pull-out portion 25A has a circular pattern having a smaller outside diameter than circuit portion 24A. Six connecting portions 26A are arranged at regular intervals in the circumferential direction at an outer circumferential portion of pull-out portion 25A. A single metallic electrode terminal portion 27A is connected to a central portion of pull-out portion 25A. Electrode terminal portion 27A has a tip portion extending through an opening in a central portion of pull-out portion 25B which will be described later and protruding from the central portion of the lower surface of ceramic base 21. That is, a portion of electrode terminal portion 27A protrudes from the lower surface of ceramic base 21.

Pull-out portion 25B is embedded in a lowermost layer of ceramic base 21. Pull-out portion 25B has an outside diameter substantially equal to or slightly smaller than that of circuit portion 24B. Pull-out portion 25B has a circular pattern with a circular opening in its central portion. Four connecting portions 26B are arranged at regular intervals in the circumferential direction at an outer circumferential portion of pull-out portion 25B. Four metallic electrode terminal portions 27B are connected around the opening in pull-out portion 25B. Electrode terminal portions 27B each have a tip portion protruding at the central portion of the lower surface of ceramic base 21. That is, a portion of electrode terminal portion 27B protrudes from the lower surface of ceramic base 21.

In this manner, wafer holder 20 in the second embodiment of the present disclosure has two conductive members 23A and 23B. Thus, an RF voltage can be applied individually to the two conductive members. Accordingly, the plasma atmosphere above wafer-mounting surface 21a can be controlled such that it varies between the inside and the outside. While the second embodiment has described a two-zone structure including the inner circular pattern and the outer annular pattern obtained by dividing wafer-mounting surface 21a into halves in its radial direction, various numbers of zones and division patterns are possible, without being limited thereto.

Figure 3:
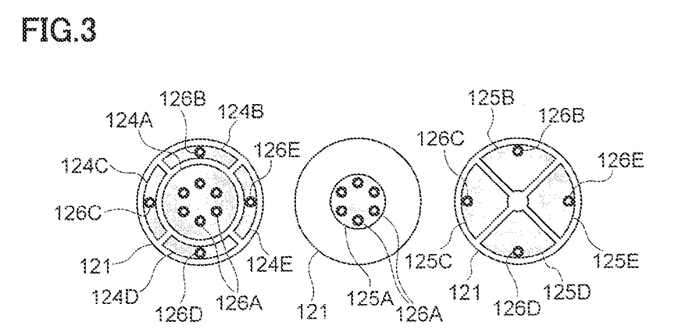
FIG. 3 shows, in a manner corresponding to FIG. 2B, a ceramic base in an alternative example of the wafer holder in the second embodiment in the directions of arrows, respectively.

In an alternative example of the second embodiment shown in FIG. 3, for example, the inner one of the two conductive members shown in FIGS. 2A and 2B described above is the same. However, the outer conductive member is divided into equal quarters in the circumferential direction of wafer-mounting surface 21a. That is, five conductive members are embedded in a ceramic base 121 to form a five-zone structure. Specifically, in ceramic base 121 shown in FIG. 3, four outer circuit portions 124B, 124C, 124D and 124E each having a shape obtained by dividing the annular pattern of FIG. 2B substantially into quarters in the circumferential direction surround from outside a circuit portion 124A having a circular pattern and located on the inner side in the same layer. These four outer circuit portions 124B to 124E are electrically connected to four pull-out portions 125B, 125C, 125D and 125E each having a fan-shaped pattern of substantially the same shape through connecting portions 126B, 126C, 126D and 126E, respectively. As such, the plasma atmosphere above a wafer-mounting surface 121a can be more finely controlled.

Figure 4A:
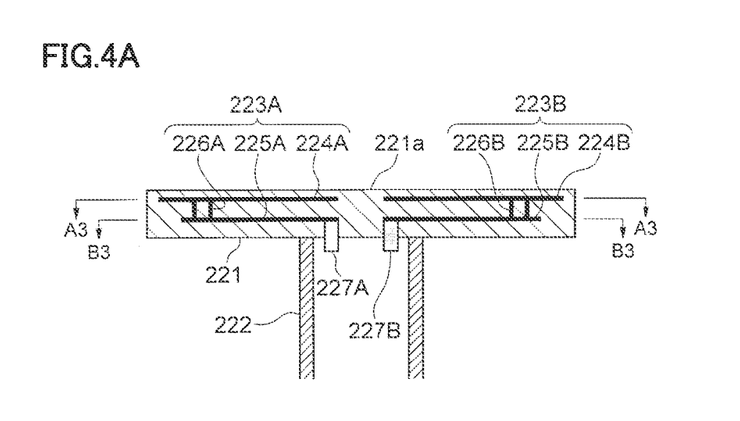
FIG. 4A is a schematic vertical sectional view of yet another alternative example of the wafer holder in the second embodiment.
Figure 4B:
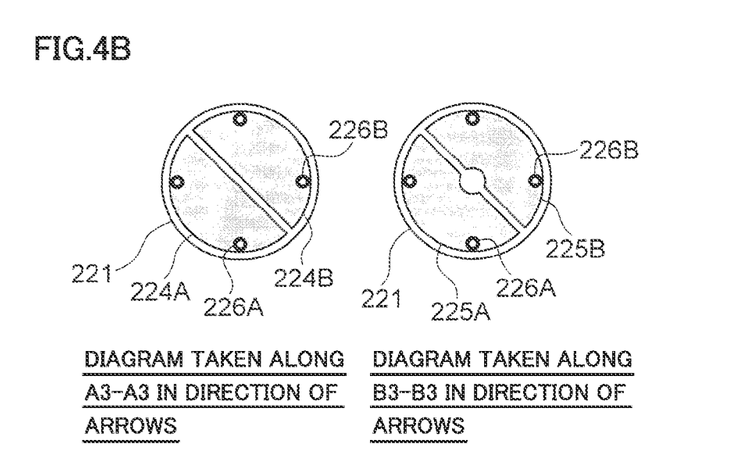
FIG. 4B shows a ceramic base in FIG. 4A taken along A3-A3 and B3-B3 in directions of arrows, respectively.

Alternatively, as in another alternative example of the second embodiment shown in FIGS. 4A and 4B, a structure may be employed in which two conductive members of the same shape are embedded in two zones, respectively, that are obtained by dividing the wafer-mounting surface into halves by a line passing through the center of the wafer-mounting surface. That is, two conductive members 223A and 223B as RF electrodes are embedded in a ceramic base 221 shown in FIG. 4A.

First conductive member 223A includes: a circuit portion 224A parallel to a wafer-mounting surface 221a; a pull-out portion 225A parallel to wafer-mounting surface 221a and spaced from circuit portion 224A in a thickness direction of ceramic base 221; and two connecting portions 226A electrically connecting these circuit portion 224A and pull-out portion 225A to each other. That is, ceramic base 221 has pull-out portion 225A spaced from circuit portion 224A in a direction opposite to a direction toward wafer-mounting surface 221a. Second conductive member 223B includes, similarly to the first one described above: a circuit portion 224B parallel to wafer-mounting surface 221a; a pull-out portion 225B parallel to wafer-mounting surface 221a and spaced from circuit portion 224B in the thickness direction of ceramic base 221; and two connecting portions 226B electrically connecting these circuit portion 224B and pull-out portion 225B to each other. That is, ceramic base 221 has pull-out portion 225B spaced from circuit portion 224B in the direction opposite to the direction toward wafer-mounting surface 221a.

As can be seen from FIG. 4B showing ceramic base 221 in FIG. 4A taken along A3-A3 and B3-B3 in directions of arrows, respectively, circuit portions 224A and 224B embedded in the same layer closest to wafer-mounting surface 221a each have a semicircular pattern obtained by the division into halves by a line passing through the center of ceramic base 221. Pull-out portions 225A and 225B embedded in the same layer closer to the lower surface of ceramic base 221 also each have a semicircular pattern obtained by the division into halves similar to the above. Circuit portion 224A and pull-out portion 225A are electrically connected to each other through two connecting portions 226A located at their outer circumferential portions. Circuit portion 224B and pull-out portion 225B are similarly electrically connected to each other through two connecting portions 226B. The two connecting portions in each conductive member are arranged line-symmetrically in the above-described semicircular pattern at such positions that two line segments extending from the center of ceramic base 221 to the two connecting portions form substantially a right angle, so that a uniform voltage can be applied to the circuit portion.

Figure 5:
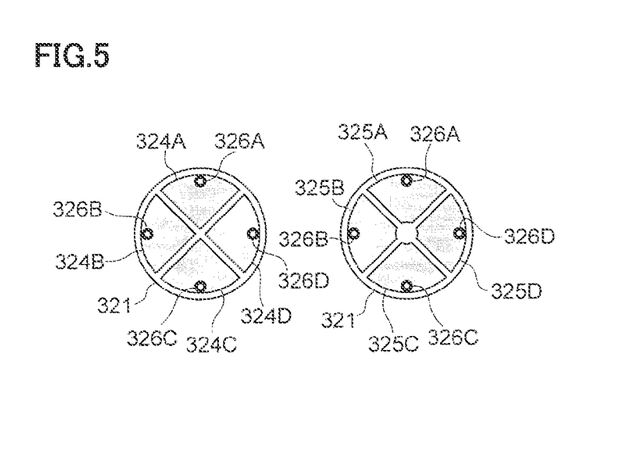
FIG. 5 shows, in a manner corresponding to FIG. 4B, a ceramic base in yet another alternative example of the wafer holder in the second embodiment in the directions of arrows, respectively.

Ceramic base 221 shown in FIGS. 4A and 4B has a two-zone structure in which two conductive members of the same shape are provided in two zones, respectively, that are obtained by dividing the wafer-mounting surface substantially into halves by a line passing through the center of the wafer-mounting surface. However, the ceramic base of the present disclosure is not limited thereto, but may have a structure obtained by dividing the wafer-mounting surface into three or more zones. For example, a wafer holder in yet another alternative example of the second embodiment shown in FIG. 5 illustrates an example of a four-zone structure obtained by dividing the wafer-mounting surface of a ceramic base 321 into quarters in the circumferential direction and embedding four conductive members of the same shape in the quarters, respectively.

Specifically, four circuit portions 324A, 324B, 324C and 324D embedded in the same layer closest to the wafer-mounting surface each have a fan-shaped pattern with a central angle of 90° obtained by dividing the wafer-mounting surface of ceramic base 321 into quarters by two lines passing through the center of the wafer-mounting surface and being orthogonal to each other. Pull-out portions 325A, 325B, 325C and 325D embedded in the same layer closer to the lower surface of ceramic base 321 also each have a fan-shaped pattern with a central angle of 90° obtained by the similar division into quarters at the same angle positions as described above. The circuit portion and the pull-out portion of each pair are electrically connected to each other through one of connecting portions 326A, 326B, 326C and 326D located at their outer circumferential portions. Such a structure allows for finer control of the plasma atmosphere above the wafer-mounting surface in the circumferential direction.

Next, a wafer holder in a third embodiment is described with reference to FIGS. 6A and 6B. A wafer holder 30 including a substantially disk-shaped ceramic base 31 and a cylindrical support 32 for supporting ceramic base 31 from a central portion of a lower surface of ceramic base 31 shown in FIG. 6A is basically the same as wafer holder 20 in the second embodiment described above, except that a single conductive member, and a circuit portion directly connecting to an electrode terminal portion without using a pull-out portion are provided in ceramic base 31.

In ceramic base 31, a second circuit portion 34A and a circuit portion 34B as RF electrodes are provided in two zones of an inner circular portion and an outer annular portion, respectively, that are obtained by dividing a wafer-mounting surface 31a in its radial direction, similarly to the division pattern shown on the left side of FIG. 2B in the second embodiment. Circuit portion 34B is electrically connected to a pull-out portion 35B through a connecting portion 36B, similarly to the second embodiment. The difference from the second embodiment is that second circuit portion 34A directly connects to a second electrode terminal portion 37A.

Figure 6A:
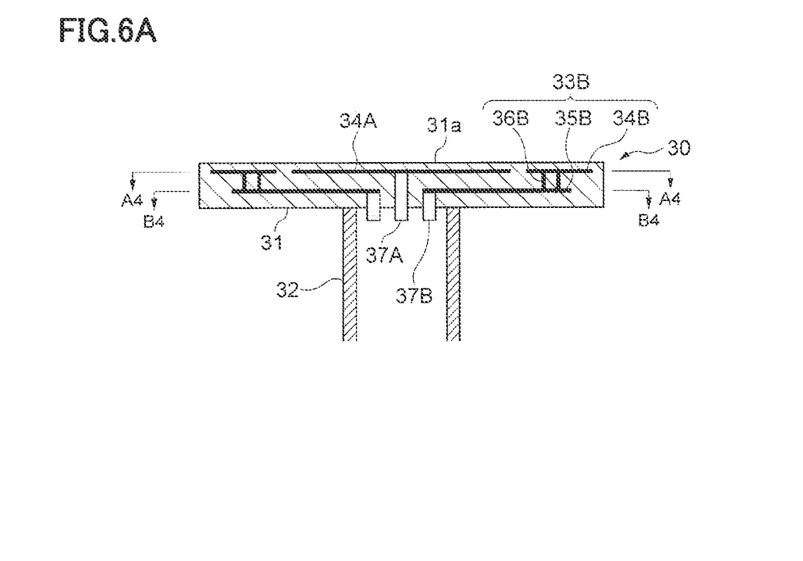
FIG. 6A is a schematic vertical sectional view of a wafer holder in a third embodiment.
Figure 6B:
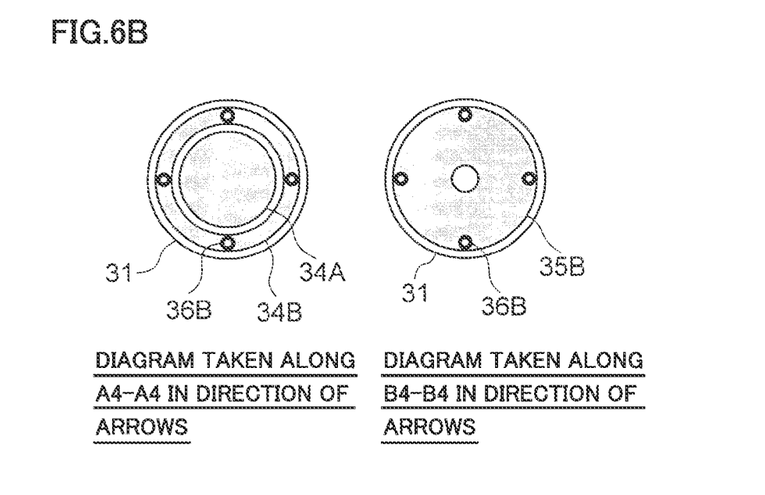
FIG. 6B shows a ceramic base in FIG. 6A taken along A4-A4 and B4-B4 in directions of arrows, respectively.

That is, as can be seen from FIG. 6B showing ceramic base 31 in FIG. 6A taken along A4-A4 and B4-B4 in directions of arrows, respectively, second circuit portion 34A electrically connects to second electrode terminal portion 37A directly without using a pull-out portion and a connecting portion for connection to the pull-out portion. A portion of second electrode terminal portion 37A protrudes from the lower surface of ceramic base 31. A portion of second electrode terminal portion 37A is housed in cylindrical support 32. On the other hand, a single conductive member 33B includes, similarly to FIG. 2B: circuit portion 34B parallel to wafer-mounting surface 31a; pull-out portion 35B parallel to wafer-mounting surface 31a and spaced from circuit portion 34B in a thickness direction of ceramic base 31; and four connecting portions 36B electrically connecting circuit portion 34B and pull-out portion 35B to each other. That is, ceramic base 31 has pull-out portion 35B spaced from circuit portion 34B in a direction opposite to a direction toward wafer-mounting surface 31a. In this manner, second circuit portion 34A located in a central portion of wafer-mounting surface 31a directly connects to second electrode terminal portion 37A without using a pull-out portion. Thus, the number of layers in which the conductive members are embedded within ceramic base 31 can be reduced to two, thus allowing for simple manufacture.

While the third embodiment above has described a two-zone structure including the inner circular pattern and the outer annular pattern obtained by dividing wafer-mounting surface 31a into halves in its radial direction, various numbers of zones and division patterns are possible, without being limited thereto. In an alternative example of the third embodiment shown in FIG. 7, for example, the inner circuit portion is similar to that shown in FIGS. 6A and 6B described above. However, the outer conductive member is divided into equal quarters in the circumferential direction of a wafer-mounting surface 131a, to form a five-zone structure.

Figure 7:
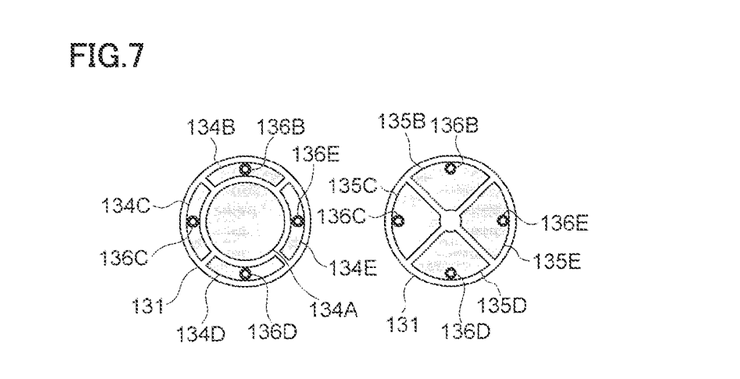
FIG. 7 shows, in a manner corresponding to FIG. 6B, a ceramic base in yet another alternative example of the wafer holder in the third embodiment in the directions of arrows, respectively.

Specifically, in a ceramic base 131 in the alternative example shown in FIG. 7, four outer circuits 134B, 134C, 134D and 134E each having a shape obtained by dividing the annular pattern of FIG. 6B substantially into quarters in the circumferential direction surround from outside a second circuit portion 134A having a circular pattern and located on the inner side in the same layer. These four outer circuit portions 134B to 134E electrically connect to four pull-out portions 135B, 135C, 135D and 135E each having a fan-shaped pattern of substantially the same shape through connecting portions 136B, 136C, 136D and 136E, respectively. As such, the plasma atmosphere above wafer-mounting surface 131a can be more finely controlled.

Figure 8:
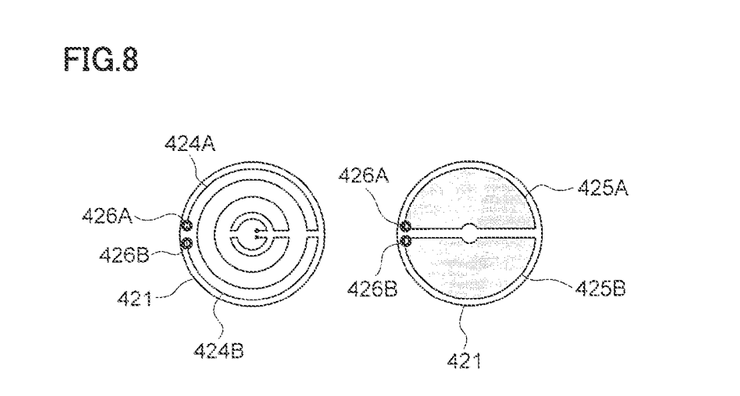
FIG. 8 shows, in a manner corresponding to FIG. 4B, a ceramic base in yet another alternative example of the wafer holder in the second embodiment in the directions of arrows, respectively.

While the circuit portion has been described as being an RF electrode in all of the first to third embodiments above, the present disclosure is not limited thereto. The circuit portion may be a resistance heating element. When there are two or more conductive members, one of them may be an RF electrode and the other may be a resistance heating element. FIG. 8 shows, for example, the two-zone structure of the second embodiment, in which two resistance heating elements are embedded as circuit portions 424A and 424B in the same layer closest to the wafer-mounting surface of a ceramic base 421.

That is, in ceramic base 421, circuit portions 424A and 424B are embedded in two zones, respectively, each of which has a substantially semicircular pattern obtained by dividing the wafer-mounting surface into halves by a line passing through the center of the wafer-mounting surface. Circuit portions 424A and 424B have a circuit pattern shaped in such a manner that concentric curved portions and line portions are connected as if they are drawn in a single stroke. These circuit portions electrically connect to pull-out portions 425A and 425B each having a semicircular pattern and spaced in a thickness direction of ceramic base 421 through connecting portions 426A and 426B, respectively. That is, ceramic base 421 has pull-out portions 425A and 425B spaced from circuit portions 424A and 424B in the direction opposite to the direction toward the wafer-mounting surface. Pull-out portions 425A and 425B each electrically connect to the electrode terminal portion not shown in the figure, and each have a tip portion protruding at a central portion of a lower surface of ceramic base 421. It should be noted that a portion of each of pull-out portions 425A and 425B that corresponds to the central portion of the wafer-mounting surface is cut out in semicircular form so as not to interfere with one of the pair of electrodes of each resistance heating element.

It should be understood that the embodiments disclosed herein are illustrative and non-restrictive in every respect. The present disclosure is not limited to these illustrations but is defined by the terms of the claims, and is intended to include any modifications within the meaning and scope equivalent to the terms of the claims.

EXAMPLE

Slurry was produced from 99.5 parts by mass of aluminum nitride powders, with 0.5 parts by mass of yttrium oxide added as a sintering aid, and also with the addition of a binder and an organic solvent, which were all mixed in a ball mill. The slurry thus obtained was sprayed by a spray drying method to produce granules. The granules were pressed into three molded bodies of the same shape. These molded bodies were degreased at 700° C. in a nitrogen atmosphere and then sintered at 1850° C. in the nitrogen atmosphere, to provide three aluminum nitride sintered materials. The sintered materials thus obtained were each processed into a disk shape having a diameter of 330 mm and a thickness of 8 mm. At this time, the surface roughness was 0.8 μm in Ra and the flatness was 50 μm.

One of these three aluminum nitride sintered materials that will act as a middle portion was perforated at its central portion with six through holes having an inside diameter of 8.0 mm at regular intervals in a circumferential direction. Moreover, W paste was applied to the outer surface of a cylindrical aluminum nitride sintered material having an outside diameter of 7.9 mm and fabricated under the same conditions as described above, followed by degreasing at 700° C. in a nitrogen atmosphere and then by sintering at 1830° C. in the nitrogen atmosphere to make six connecting portions 16 each having an outside diameter of 8.0 mm and a height of 8 mm. Connecting portions 16 were fitted into the above-described through holes. To form a circular pattern for circuit portion 14 shown on the left side of FIG. 1B on one side of this sintered material that will act as a middle portion, and to form a circular pattern for pull-out portion 15 shown on the right side of FIG. 1B on the other side, W paste was applied by screen printing, followed by degreasing at 700° C. in a nitrogen atmosphere and then by sintering at 1830° C. in the nitrogen atmosphere.

Next, an adhesive material mainly composed of adhesive aluminum nitride was applied to one side of each of the two sintered materials that will act as a top portion and a bottom portion, respectively, followed by degreasing. These two sintered materials were joined to each other with the sintered material that will act as a middle portion interposed between, so that these sides of the top and the bottom portions to which the adhesive material was applied face the sintered material that will act as a middle portion. The joined body thus obtained was provided with a single hole by counter boring at its lower surface such that the hole reaches a central portion of pull-out portion 15, and electrode terminal portion 17 made of W was fitted into this hole so as to abut pull-out portion 15.

To the lower surface of ceramic base 11 thus fabricated, one end of cylindrical support 12 made of AlN, which had an inside diameter of 60 mm, a height of 150 mm, a thickness of 2 mm, and which had flange portions at its opposite ends, was joined with screws. The gap between the flange portion and the joining surface of ceramic base 11 was hermetically sealed with an O ring. Then, a power feed line was connected to electrode terminal portion 17 protruding from the lower surface of ceramic base 11 on the inner side of cylindrical support 12. Wafer holder 10 of a sample 1 thus fabricated was mounted into a chamber of a CVD apparatus, and the other end of cylindrical support 12 was fixed to the bottom of the chamber with a clamp in a hermetically sealed manner with an O ring.

For comparison, two disk-shaped sintered materials having thicknesses of 8 mm and 16 mm, respectively, were fabricated, instead of the three disk-shaped sintered materials each having a thickness of 8 mm. In a manner similar to sample 1 described above, except that a film for circuit portion 14 was formed on one side of the sintered material having a thickness of 8 mm, and an adhesive material similar to the above was applied to one side of the sintered material having a thickness of 16 mm, followed by degreasing and then by joining of both sintered materials that were overlapped with each other, a wafer holder of a sample 2 was fabricated in which the electrode terminal portion was directly connected to the central portion of the circuit portion without using a pull-out portion and a connecting portion for connection to the pull-out portion, and the wafer holder was mounted into the chamber. Each of these wafer holders of samples 1 and 2 was subjected to operation in which a radio frequency voltage of 13.56 MHz was applied while a 300 mm 17-point wafer temperature detector manufactured by SensArray Corporation was mounted on the wafer-mounting surface. As a result, a high degree of thermal uniformity of the wafer-mounting surface was maintained without variation in sample 1, whereas the thermal uniformity degraded due to temperature increase at the central portion caused by local heat generation at the central portion in sample 2. This may be due to an overload at a connecting portion to the electrode terminal portion.

REFERENCE SIGNS LIST 10, 20, 30 wafer holder
11, 21, 31, 121, 131, 221, 321, 421 ceramic base
11a, 21a, 31a, 221a wafer-mounting surface
12, 22, 32, 222 cylindrical support
13, 23A, 23B, 33B, 223A, 223B conductive member
14, 24A, 24B, 34B, 224A, 224B, 124A, 124B, 124C, 124D, 124E, 134B, 134C, 134D, 134E, 224A, 224B, 324A, 324B, 324C, 324D, 424A, 424B circuit portion
34A, 134A second circuit portion
15, 25A, 25B, 35B, 225A, 225B, 125A, 125B, 125C, 125D, 125E, 135B, 135C, 135D, 135E, 225A, 225B, 325A, 325B, 325C, 325D, 425A, 425B pull-out portion
16, 26A, 26B, 36B, 226A, 226B, 126A, 126B, 126C, 126D, 126E, 136B, 136C, 136D, 136E, 226A, 226B, 326A, 326B, 326C, 326D, 426A, 426B connecting portion
17, 27A, 27B, 37B, 227A, 227B electrode terminal portion
37A second electrode terminal portion

The invention claimed is:

1. A wafer holder comprising:
a ceramic base having a wafer-mounting surface as an upper surface;
a first conductive member embedded in the ceramic base, the first conductive member including
a first circuit portion provided parallel to the wafer-mounting surface,
a first pull-out portion provided parallel to the wafer-mounting surface and spaced from the first circuit portion in a direction opposite to a direction toward the wafer-mounting surface, wherein the first pull-out portion is located in a first layer in a thickness direction of the ceramic base, and
a first plurality of connecting portions configured to electrically connect the first circuit portion and the first pull-out portion to each other;
a second conductive member embedded in the ceramic base, the second conductive member including
at least one second circuit portion provided parallel to the wafer-mounting surface,
at least one second pull-out portion provided parallel to the wafer-mounting surface and spaced from the at least one second circuit portion in the direction opposite to the direction toward the wafer-mounting surface, wherein the at least one second pull-out portion is located in a second layer in the thickness direction of the ceramic base, the second layer being spaced from the first layer in the thickness direction, and
a second plurality of connecting portions configured to electrically connect the at least one second circuit portion and the at least one second pull-out portion to each other;
a cylindrical support configured to support a lower surface of the ceramic base; and
an electrode terminal portion connected to the first pull-out portion, wherein
a portion of the electrode terminal portion protrudes from the lower surface of the ceramic base and is housed in the cylindrical support, and
the first plurality of connecting portions are arranged in a circumferential direction at an outer circumferential portion of the first pull-out portion.

2. The wafer holder according to claim 1, wherein the first conductive member constitutes an RF electrode.

3. The wafer holder according to claim 1, wherein each of the first and second conductive members constitutes an RF electrode.

4. The wafer holder according to claim 1, wherein the ceramic base has a disk shape.

5. The wafer holder according to claim 1, wherein the cylindrical support has a circular cylindrical shape.

6. The wafer holder according to claim 1, wherein the first circuit portion and the at least one second circuit portion are located in the same layer in the thickness direction of the ceramic base.

7. The wafer holding according to claim 1, wherein the first plurality of connecting portions include a ceramic member covered with a metal layer.

8. The wafer holder according to claim 7, wherein the ceramic member is made of a ceramic material selected from the group consisting of aluminum nitride, silicon nitride, silicon carbide, and aluminum oxide.

9. The wafer holder according to claim 7, wherein the ceramic base is made of a first ceramic material, and the ceramic member is made of a second ceramic material having substantially the same coefficient of thermal expansion as the first ceramic material.

10. The wafer holder according to claim 7, wherein the ceramic member is made of the same ceramic material as the ceramic base.

* * * * *